United States Patent [19]
Nepple et al.

[11] Patent Number: 5,986,513
[45] Date of Patent: Nov. 16, 1999

[54] PHASE LOCKED LOOP WITH LIMITED LOCK TIME

[75] Inventors: Bruce C. Nepple; Jeffrey R. Owen; Daniel J. Park, all of Portland, Oreg.

[73] Assignees: Elko Corp.; Seiko Epson Corp, both of Tokyo, Japan

[21] Appl. No.: 07/563,767

[22] Filed: Aug. 6, 1990

[51] Int. Cl.[6] ...................................................... H03L 7/00
[52] U.S. Cl. .............................................. 331/17; 331/25
[58] Field of Search ........................ 331/17, 25; 328/133, 328/134, 155; 307/511, 516, 526

[56] References Cited

U.S. PATENT DOCUMENTS 4,926,140  5/1990  Schenberg .............................. 331/17 X Primary Examiner—Robert J. Pascal
Attorney, Agent, or Firm—Elmer Galbi

[57] ABSTRACT

A phase locked loop circuit employing a single phase detector provides limited maximum lock time by avoiding hang-up. The circuit first establishes a gross indication of phase relation sufficient to establish a direction of phase shift away from the unstable equilibrium point. The phase is then shifted by a predetermined value to establish a bounded phase relation exclusive of the unstable equilibrium point and inclusive of the stable equilibrium point. Conventional phase locking then provides the desired frequency and phase relation, but without potential for hang-up.

9 Claims, 4 Drawing Sheets

PHASE LOCKED LOOP WITH LIMITED LOCK TIME

The present invention relates to phase locked loop circuitry and particularly to a method and apparatus for limiting the maximum lock time of a simple phase locked loop circuit.

BACKGROUND OF THE INVENTION

Phase locked loops receive an input signal and respond by producing an output signal of substantially the same frequency with a predetermined phase relation to the input signal. The output signal may, for example, be used as the basis for sampling a data signal wherein matching of frequency and establishing a given phase relation with the data signal are essential to accurate information recovery.

An important characteristic of a phase locked loop is the maximum lock time, i.e., the maximum time required to establish the desired frequency and phase relation. Average lock time is an important measure of circuit performance, but maximum lock time must be considered in allocation of time permitted for phase acquisition. More particularly, a phase locked loop circuit must be allowed at least its maximum lock time before the output can be considered valid.

Phase locked loop circuits suffer from "hang-up", a condition where the circuit dwells about a reverse null point, an unstable equilibrium point having a large phase error. The source of hang-up is generally attributed to the small correcting voltage produced by the phase detector in the vicinity of the reverse null and by equivocation about the reverse null caused by signal noise. If the initial phase error is close to the reverse null point, then hang-up is likely and phase acquisition is delayed. The maximum lock time for a circuit susceptible to hang-up must account for the possibility of delay caused by hang-up. Thus, circuits susceptible to hang-up have greater maximum lock time and must be allocated greater time for phase acquisition.

Fast phase acquisition is essential in, for example, burst mode signal communication systems where rapid phase acquisition promotes efficient channel time usage and, for battery operated devices, reduces battery consumption. Typically a phase locked loop must establish a phase relation with the data signal during a short synchronization preamble preceding a data burst. Failure of the phase locked loop to quickly establish phase acquisition results in loss of the data burst. If a phase locked loop circuit has a large maximum lock time, e.g., due to the possibility of occasional hang-up, the circuit must be given a correspondingly large time interval for phase acquisition. To conserve battery life, however, fast phase acquisition may be required to reduce overall receiver activation time. In many communication systems, therefore, a large phase acquisition interval is unacceptable.

Quick locking phase locked loops are known. These circuits generally employ additional components, typically at least two multipliers or phase detectors in a more complex circuit, to avoid hang-up and achieve rapid phase acquisition. Thus, while fast locking phase locked loops are available, they come at the cost of increased number of phase detectors and circuit complexity.

A phase locked loop circuit having reduced maximum lock time is useful because the phase locked loop output may be more quickly regarded as valid. It would be desirable, therefore, to provide a phase locked loop circuit with a single phase detector, not vulnerable to hang-up, and having limited maximum lock time.

SUMMARY OF THE INVENTION

A phase locked loop according to the present invention samples the input signal long enough to determine a gross phase relation between the input signal and the phase of the output signal. Based on this gross phase relation, the output signal is substantially instantaneously phase shifted to establish a bounded phase relation which excludes the unstable equilibrium point.

Additional sampling of the input signal may be optionally used to establish a second gross phase relation within the bounded phase relation. The output signal is again phase shifted by a second phase shift value, smaller than the first phase shift value, to establish a more tightly bound phase relation between the input signal and the output signal. Additional iterations of sampling and phase shifting by smaller values can be used to further restrict the range of possible phase relations.

Once the unstable equilibrium point is excluded, i.e., following at least the first sample period and phase shift, a conventional phase locked loop method establishes and maintains the desired frequency and phase relation. Because the unstable equilibrium point is avoided at the outset, hang-up is avoided and maximum lock time for the circuit is reduced.

DETAILED DESCRIPTION

Figure 1:
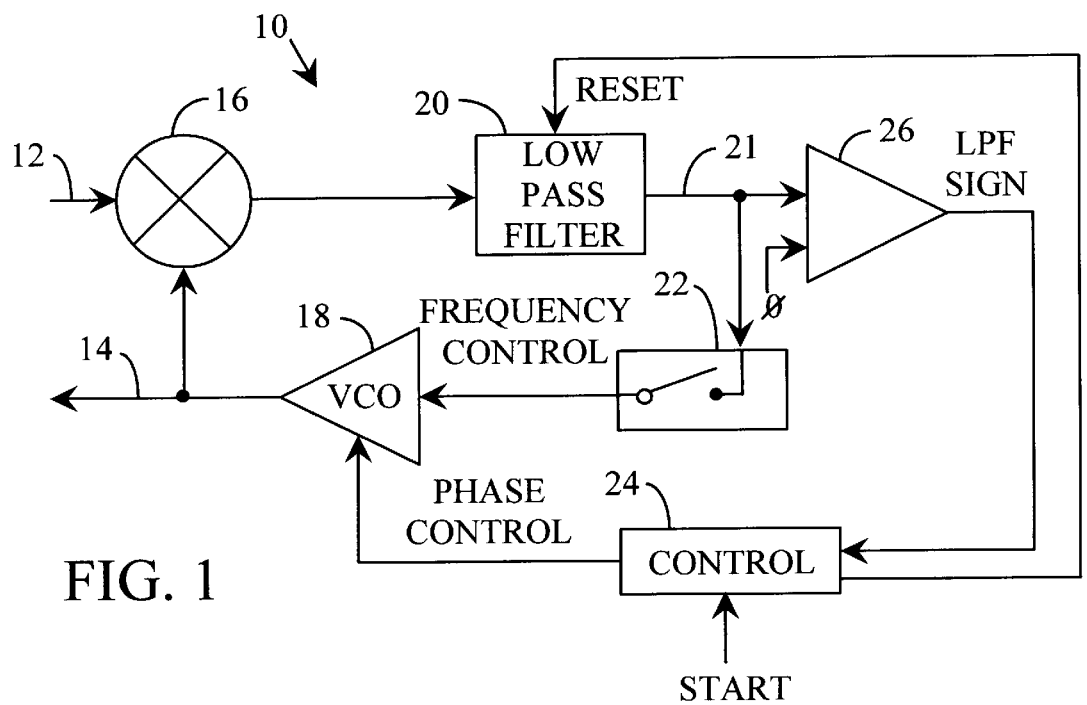
FIG. 1 is a block diagram of a phase locked loop circuit in accordance with the present invention.

FIG. 1 is a block diagram of a phase locked loop circuit 10 in accordance with the present invention. Circuit 10 is a simple phase locked loop, but modified as follows in accordance with the present invention. Conventional phase locked loop components include phase detector or multiplier 16, a low pass filter 20 and a voltage controlled oscillator (VCO) 18. Components of circuit 10 not conventionally found in a phase locked loop include a comparator as a sign detector 26 providing an LPF SIGN signal indicating the sign of the output 21 of low pass filter 20, a switch 22 for selectively coupling the low pass filter 20 output to the VCO 18, and a control 24 for directing circuit operation. Switch 22 allows circuit 10 to run "open loop." When switch 22 is open, it is assumed that the VCO 18 runs at a frequency very close to the expected frequency of the input signal. Low pass filter 20 receives an additional RESET signal which acts to clear the storage components of filter 20 and produce a zero output. VCO 18 has a standard FREQUENCY CONTROL input, but includes a non-standard PHASE CONTROL input which allows substantially instantaneous phase shifting, in this embodiment phase shifting by predetermined amounts including, for example, +90, −90, +45, and −45 degrees. Control 24 receives the LPF SIGN signal, operates switch 22, resets low pass filter 20, and provides the PHASE CONTROL signal to VCO 18 in accordance with the flow chart, discussed in more detail hereafter, shown in FIG. 2.

Figure 3:
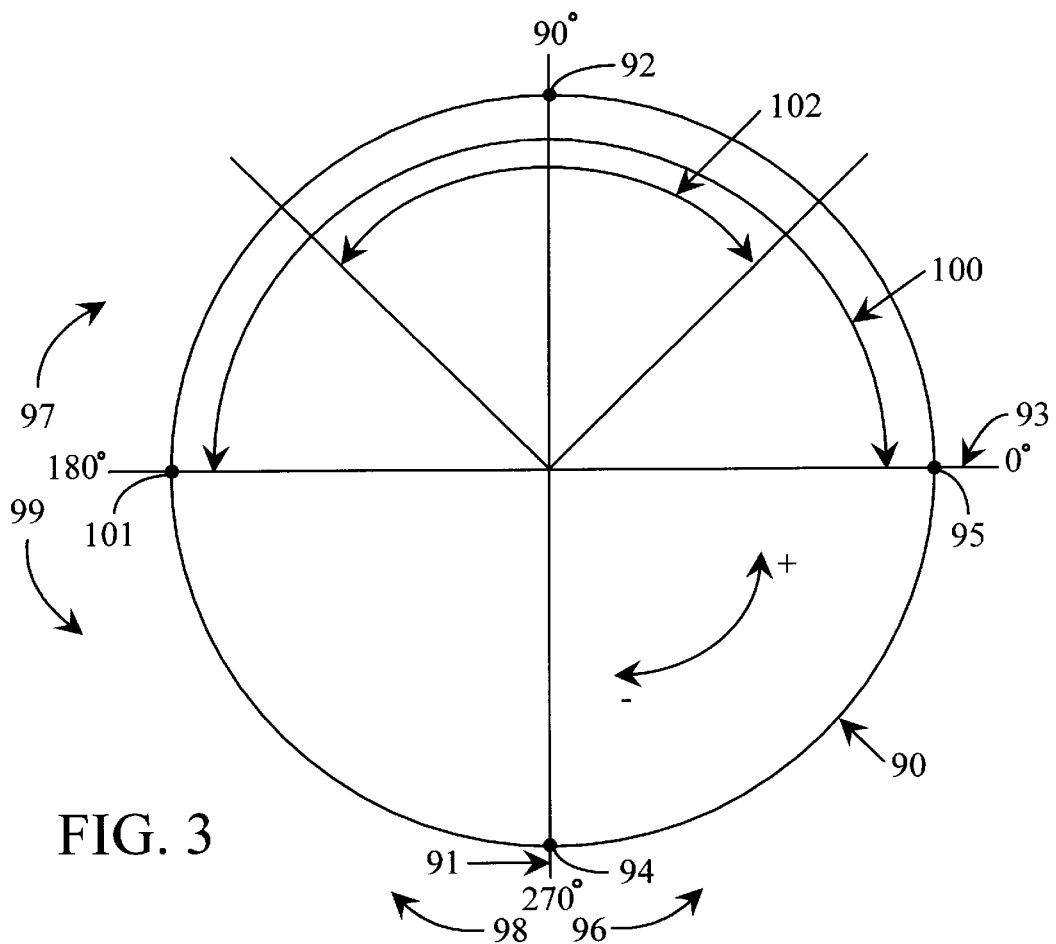
FIG. 3 is a phase diagram illustrating bounded phase relations established by the phase locked loop circuit of FIG. 1.

Circuit 10 receives an input signal 12 and, following a maximum lock time for circuit 10, produces a valid output signal 14. Output signal 14, when valid, has substantially the same frequency as signal 12 and bears a predetermined phase relation to the input signal 12. In the embodiment of FIG. 1, wherein a multiplier is used as a phase detector and the VCO 18 has a positive $K_0$, a valid output signal 14 has a positive 90 degree phase relation to input signal 12. FIG. 3 illustrates the phase relation between input signal 12 and output signal 14 during phase acquisition by circuit 10. The outer circle 90 of FIG. 3 represents the phase plane or range of possible initial phase relations. Because the initial phase relation is arbitrary, circle 90 represents a 360 degree range of possible initial phase relations. The upper point 92 of circle 90 represents the desired phase relation, i.e., the stable equilibrium point, and the lower point 94, 180 degrees offset from point 92, represents the reverse null point or unstable equilibrium point.

In the illustrated embodiment, the stable equilibrium point 92 corresponds to a 90 degree phase relation and the unstable equilibrium point 94 corresponds to a 270 degree phase relation. Because the stable and unstable equilibrium points are separated by 180 degrees, the phase plane as represented by circle 90 is divided by a vertical axis 91 extending between points 92 and 94. Thus, axis 91 defines a right halfplane 96 requiring a positive, i.e., counter-clockwise along circle 90, phase shift for the shortest path to stable equilibrium point 92, and a left halfplane 98 requiring a negative, i.e., clockwise along circle 90, phase shift for the shortest path to point 92. Upper and lower halfplanes 97 and 99, respectively, are defined by the horizontal axis 93, lying orthogonal to the axis 91 and extending between a 0 degree phase relation point 95 (within right halfplane 96) and a 180 degree phase relation point 101 (within left halfplane 98).

The closer the initial phase relation is to point 94 the greater the phase acquisition time, i.e. time until the phase relation reaches a region near point 92. For an initial phase relation very near point 94, hang-up occurs and phase acquisition is undesirably delayed. As will be explained in greater detail hereafter, circuit 10 determines which of halfplanes 96 and 98 contain the initial phase relation. Based on this determination, circuit 10 phase shifts output signal 14 to establish a phase relation within upper halfplane 97 to avoid the reverse null point 94 and therefore avoid hang-up. Additional phase shifting of signal 14 further restricts the phase relation, but always inclusive of the target phase relation represented by point 92.

Returning to FIG. 1, the input signal 12 is applied to multiplier 16. Multiplier 16 also receives the output signal 14 as produced by VCO 18. The output of multiplier 16 is applied to low pass filter 20 whose output 21 represents a phase relation between the input signal 12 and the output signal 14. The sign and magnitude of output 21 provide a correcting voltage signal which, through switch 22, is applied as the FREQUENCY CONTROL input to VCO 18 to achieve the desired phase relation.

Switch 22 selectively couples the output 21 of low pass filter 20 to FREQUENCY CONTROL input of VCO 18. With switch 22 closed, circuit 10 operates as a conventional phase locked loop where the continuously changing voltage of output 21 taken from low pass filter 20 continuously moves the frequency of the output signal 14, i.e., the output of VCO 18, toward the desired frequency and phase relation. Such a conventional phase locked loop is vulnerable to hang-up when the initial phase relation between input signal 12 and output signal 14 is near the reverse null point 94, in this case near 270 degrees. The potential for hang-up increases the maximum lock time for a phase locked loop circuit. In this embodiment, control circuit 24 maintains switch 22 open during initial phase determination, but closes switch 22 after restricting the phase relation to exclude the reverse null point 94. As will be discussed hereafter, switch 22 is optional and may be omitted leaving filter 20 continuously coupled to VCO 18.

The PHASE CONTROL input of VCO 18 provides substantially instantaneous shifting of the phase of output signal 14. In a digital implementation, for example, such instantaneous phase shifting is accomplished during a given cycle of the digital VCO or NCO operation. In an analog design, for example, instantaneous phase shifting is provided by selectively gating the output from a variety of phase shifting devices each providing a different phase offset. Control circuit 24 directs this phase shifting based on the output of sign detector 26. Sign detector 26 compares the output 21 of low pass filter 20 with a zero voltage input whereby a bi-level LPF SIGN signal available to control circuit 24 represents the sign of the low pass filter output 21. Thus, the LPF SIGN signal indicates a halfplane or gross phase relation between the input signal 12 and the output signal 14. More particularly, the LPF SIGN signal indicates one of halfplanes 96 and 98, as defined by the stable and unstable equilibrium points 92 and 94, containing the present phase relation of output signal 14 relative to input signal 12.

Figure 2:
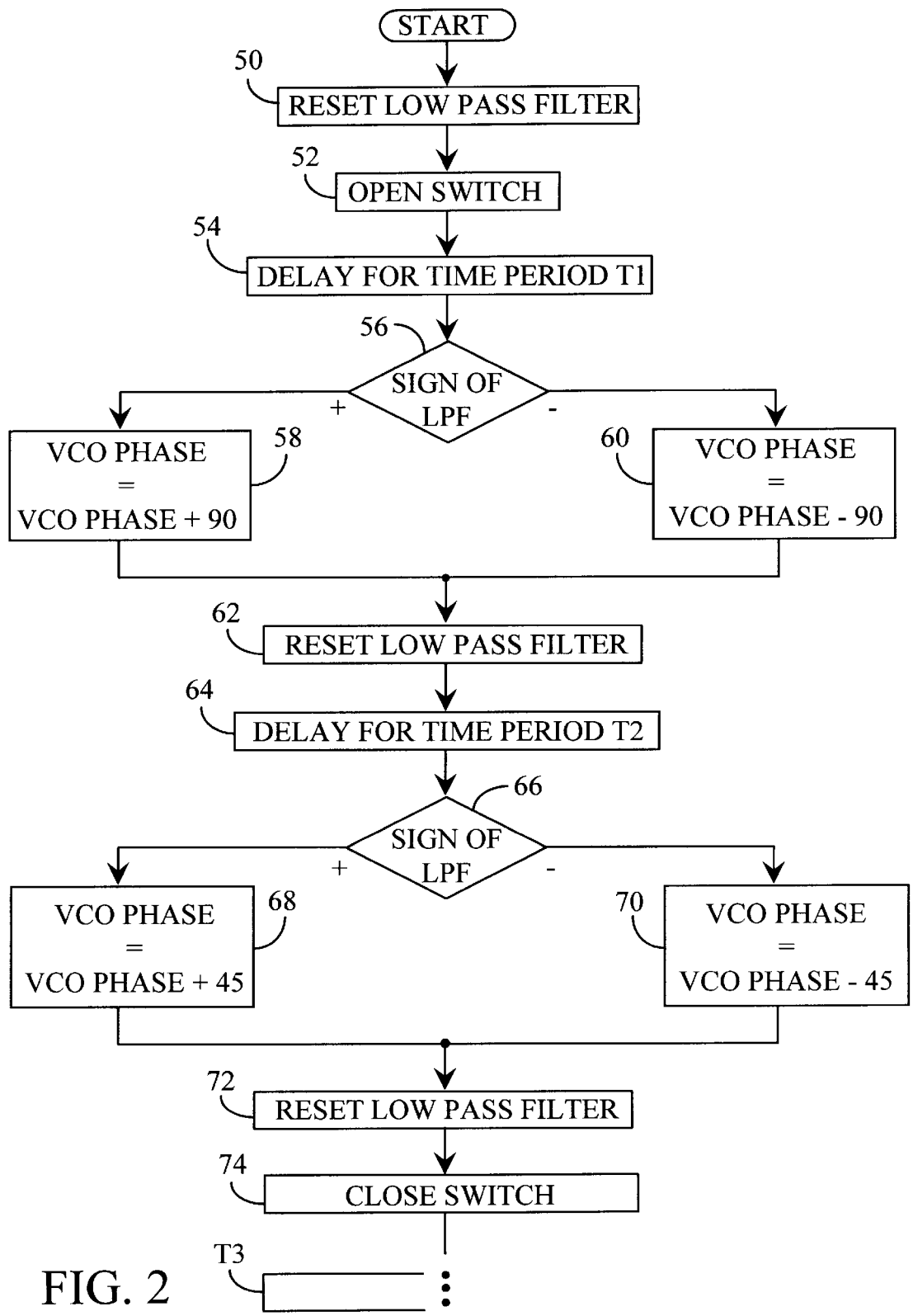
FIG. 2 is a flow chart illustrating control steps in the operation of the phase locked loop circuit of FIG. 1.

Circuit 10 receives a START signal, e.g., by removal of a reset voltage, at control circuit 24 to initiate phase acquisition. FIG. 2 is a flow chart illustrating operation of control circuit 24 in accordance with the present invention. As will be appreciated by those skilled in the art, control 24 may be implemented as a microprocessor function or as a state machine. In block 50 of FIG. 2, control circuit 24 applies the RESET signal to low pass filter 20 and, in block 52, opens switch 22. With switch 22 open, VCO 18 produces a default output signal 14 at the expected frequency of input signal 12, but initially having an arbitrary phase relation to input signal 12.

In block 54 control circuit 24 delays for an interval T1 long enough for low pass filter 20 to provide a valid output signal 21 to sign detector 26. More particularly, time interval T1 is only long enough for the sign of the output 21 of low pass filter 20 to identify, to a desired degree of certainty, one of halfplanes 96 and 98 containing the present phase relation. Following interval T1, sign detector 26 provides the LPF SIGN signal as a representation of the sign of the output 21 of low pass filter 20. Thus, LPF SIGN signal corresponds to the direction of phase shift required to move the present phase relation away from the unstable equilibrium point.

The sign of output 21 is tested in decision block 56. If the sign of output 21 is positive, control circuit 24 applies in block 58 a PHASE CONTROL input signal to VCO 18 shifting substantially instantaneously the phase of output signal 14 by positive 90 degrees. If, on the other hand, the sign output 21 is negative, the PHASE CONTROL input provided by control circuit 24 in block 60 shifts the phase of output signal 14 by negative 90 degrees. Control circuit 24 then immediately applies in block 62 the RESET signal to low pass filter 20 and delays in block 64 for a second time interval T2. During interval T2 low pass filter 20 produces an output signal indicating which halfplane now contains the phase relation between input signal 12 and output signal 14.

Following interval T2, control circuit 24 branches at block 66 based on the sign of the output 21. During this iteration, however, the magnitude of phase shifting is reduced. Thus, if the sign of output 21 was positive following interval T2, control circuit 24 produces in block 68 a PHASE CONTROL input signal for VCO 18 shifting the phase of output signal 14 by positive 45 degrees. For a negative output 21 following interval T2, control circuit 24 shifts in block 70 the phase of output signal 14 by negative 45 degrees.

Control circuit 24 then applies in block 72 the RESET signal to low pass filter 20 and, in block 74, closes switch 22. Once switch 22 is closed, circuit 10 operates in conventional PLL fashion changing in a continuous way the phase relation between input signal 12 and output signal 14 as desired. Following a time interval T3, the output signal 14 then bears the desired frequency and phase relation to input signal 12. Thus, the maximum lock time for circuit 10 is approximately the sum of time intervals T1, T2 and T3. Following the first shifting of output signal 14 in either of blocks 58 or 60 the reverse null or unstable equilibrium point 94 is avoided. Circuit 10 is then not vulnerable to hang-up and maximum lock time is reduced. The first phase shift of output signal 14 bounds the possible phase relation between input signal 12 and output signal 14 within upper halfplane 97 and for each subsequent sample period and phase shift, the phase relation is more tightly bound.

In FIG. 3, following the initial sample period T1, the LPF SIGN signal presented to control circuit 24 indicates whether the present phase relation is within the halfplane 96 or the halfplane 98 of circle 90. Phase shifting of output signal 14 by positive 90 degrees, when the phase relation is within right halfplane 96, or negative 90 degrees, when the phase relation is in left halfplane 98 restricts the range of possible phase relations to the upper halfplane 97 as represented by hemi-circle 100. In a worst case situation the initial phase relation would be very near point 94 and phase shifting by 90 degrees, either positive or negative, brings the phase relation within upper halfplane 97 and therefore to within 90 degrees of the stable equilibrium point 92. Thus, for any initial phase relation, the first phase shift of output signal 14 restricts the possible phase relation to a range of 180 degrees as indicated by hemi-circle 100, inclusive of the stable equilibrium point 92 and exclusive of the unstable equilibrium point 94.

The next sample period T2 and subsequent phase shifting of output signal 14 further restricts the range of possible phase relation between input signal 12 and output signal 14. Because output signal 14 is phase shifted by 45 degrees away from point 94, the range of possible phase relations is bounded by the quarter circle 102 extending 45 degrees on each side of stable equilibrium point 92. Additional phase shifting by successively smaller magnitudes of phase shift, e.g., by positive or negative 22.5 degrees in the next iteration, further restricts the range of possible phase relations.

Thus, for each sample period and associated phase shifting of output signal 14, by smaller and smaller shift values, the range of possible phase relations is more tightly bound, but always inclusive of the stable equilibrium point 92. It will be understood that the number of phase samplings and phase shifting may vary. The first iteration is, however, sufficient to avoid point 94 and, therefore, to avoid hangup. Once the reverse null point 94 is excluded the circuit can pursue phase acquisition in conventional fashion without risk of hangup. Subsequent sampling and phase shifting iterations may be executed if such steps achieve the desired phase relation faster than conventional operation of circuit 10, e.g. in the embodiment of FIG. 1 with switch 22 closed and control 24 taking a passive role in circuit operation. The need for additional sampling and phase shifting will vary depending on specific circuit implementations and signal characteristics.

Figure 4:
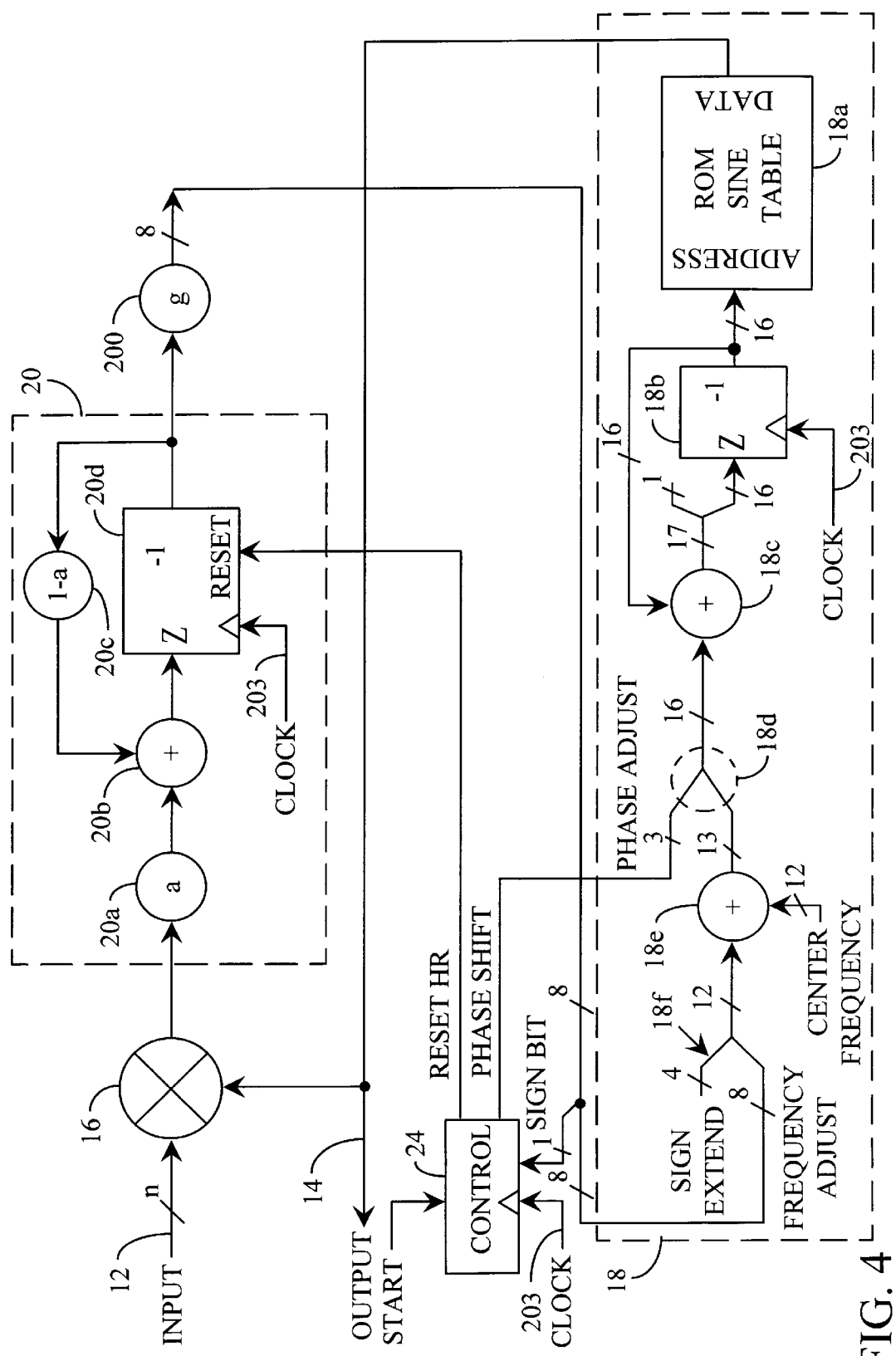
FIG. 4 is a block diagram of a digital implementation of the phase locked loop circuit of FIG. 1.

FIG. 4 illustrates a digital version of circuit 10 where input signal 12 is an n-bit value applied to a phase detector or multiplier 16. A numeric controlled oscillator (NCO) 18 corresponds to the VCO 18 of FIG. 1. A sine wave look-up table 18a of NCO 18 provides the output signal 14 to multiplier 16. An infinite impulse response (IIR) low pass filter 20 serves an integration or summing function on the output of multiplier 16. Filter 20 includes constant multipliers 20a and 20c receiving the output of multiplier 16 and establishing the bandwidth for IIR 20, respectively. A summing node 20b receives the output from constant multiplier 20a and loop feedback from constant multiplier 20c. A memory element 20d receives the sum value provided by node 20b and provides feedback to constant multiplier 20c. Gain block 200 receives the output of memory element 20d and provides scaling and truncation relative to the output of memory element 20d to provide an eight bit FREQUENCY ADJUST signal to NCO 18. Value g of block 200 sets the loop gain. The most significant bit of the FREQUENCY ADJUST value, according to a twos-complement format, contains the sign of the FREQUENCY ADJUST value and is applied as a SIGN BIT value to control 24. Memory element 20d receives a RESET signal from control 24.

A 16 bit register 18b, clocked by fixed clock signal 203, together with a summing node 18c at its input provide a rate multiplier for sine wave look-up table 18a. The output of register 18b feeds back to summing node 18c. Summing node 18c further receives input from a pseudo-summing node 18d. Pseudo-summing node 18d combines the PHASE ADJUST signal, as the three most significant bits, and the output of a summing node 18e, as the thirteen least significant bits, for application to node 18c. Summing node 18e receives a 12-bit constant CENTER FREQUENCY value and also the FREQUENCY ADJUST value, as sign extended to 12 bits as indicated at 18f.

In operation, the output of register 18b addresses table 18a at a rate corresponding to the clock 203 and the CENTER FREQUENCY value as modified by the FREQUENCY ADJUST value to provide the output signal 14 at a given frequency. Control 24 normally applies a zero valued PHASE ADJUST signal to summing node 18d whereby circuit 10 achieves and maintains phase acquisition as a normal PLL. In accordance with the present invention, however, control 24 uses the SIGN BIT to suitably inject an instantaneous, i.e. during a single clock 203 cycle, and relatively large phase shift away from the unstable equilibrium point at the outset of phase acquisition to avoid hang-up.

Control 24 of FIG. 4 operates as depicted in FIG. 2 with the exception of switch operations in blocks 52 and 74 of FIG. 2. Control 24 first resets filter 20 and, following a delay interval long enough to obtain a valid SIGN BIT, applies a PHASE ADJUST value to summing node 18d to instantaneously shift the phase of output signal 14 away from the unstable equilibrium point. At this time the range of possible phase relations between input signal 12 and output signal 14 is bounded, including the stable equilibrium point but excluding the unstable equilibrium point.

For example, to provide selected phase shifting in the embodiment of FIG. 4 the following PHASE ADJUST values are provided by control 24:

| | |
|---|---|
| +90 | 010 |
| −90 | 110 |
| +45 | 001 |
| −45 | 111 |

Normally, however, control 24 provides a value of 000 as a PHASE ADJUST value. Because these PHASE ADJUST bits are applied as the most significant bits to summing node 18c, they represent a large value relative to the value taken from summing node 18e, taken as the least significant bits at node 18c. Also, as illustrated in FIG. 4, the FREQUENCY ADJUST signal is limited to a maximum of one sixteenth of the maximum CENTER FREQUENCY value, and the CENTER FREQUENCY value must be less than one sixteenth of the clock 203 frequency. Clock signal 203 is suitably applied to control 24 and element 20d for desired clocking of circuit operations.

A phase locked loop circuit according to the present invention requires a single multiplier as a phase detector and, therefore, has limited information as to the phase relation between input signal 12 and output signal 14. More particularly, the multiplier 16 provides phase relation information in terms of a position along axis 93, and therefore establishes which of right and left halfplanes 96 and 98 contain the present phase relation. More complicated circuits use a second multiplier in conjunction with a 90 degree phase shift device, for phase relation information along vertical axis 91 and thereby distinguish between phase relations in upper and lower halfplanes 97 and 99. Using a two multipliers provides phase relation information along both axes 91 and 93, and therefore establishes an exact position along circle 90. It will be appreciated that knowing the exact position along circle 90 permits calculation of a phase shift required to shift directly to the desired phase relation represented by point 92.

Thus, while circuit 10 cannot initially distinguish between phase relations in the upper and lower halfplanes 97 and 99, initial phase shifting to restrict the phase relation to the upper halfplane 97 obviates the need for distinguishing between phase relations in the upper and lower halfplanes 97 and 99, and therefore obviates the need for a second multiplier. Knowing the amplitude of the input signal 12 and that the phase relation is restricted to the upper halfplane 97 permits a precise phase shifting calculation to achieve phase acquisition using information provided by a single multiplier. More particularly, once the desired phase relation is within upper halfplane 97 information as to phase relation along horizontal axis 93, as provided by the signal multiplier 16, is sufficient to determine an exact phase shift needed to reach the desired phase relation, i.e. to reach the point 92 on circle 90.

Figure 5:
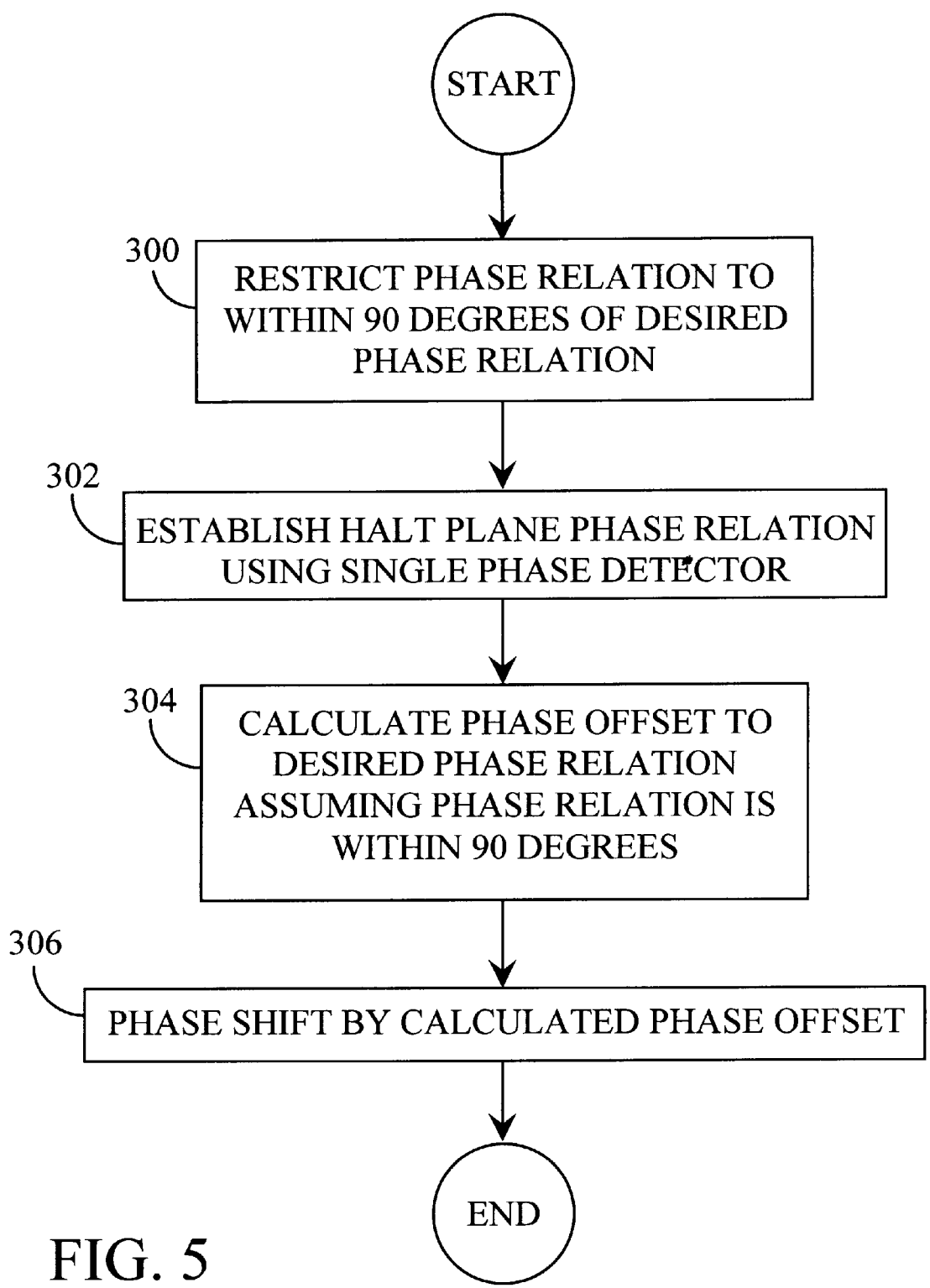
FIG. 5 is a flow chart illustrating operation of a simple phase locked loop circuit for calculating a required phase offset using a single phase detector.

FIG. 5 illustrates a method of phase acquisition using this capability of a single multiplier phase locked loop according to the present invention. In block 300 of FIG. 5, control 24 restricts the phase relation to within 90 degrees of the desired phase relation. This is accomplished as described above, requiring at least one sampling and phase shifting and, depending on the extent signal error, possibly two iterations to guarantee that the phase relation is restricted to the upper halfplane 97. In block 302, control 24 establishes a halfplane phase relation as described above using information provided by the single phase detector. Continuing to block 304, control 24 calculates a phase offset to the desired phase relation base on information provided by the single phase detector and by virtue of the assumption that the phase relation is restricted to the upper halfplane 97. Phase acquisition is then achieved in block 306 by phase shifting the output signal 14 by the calculated offset. If the device has limited phase shifting capability, e.g. discrete phase shifting capability, control 24 phase shifts by the value closest to the calculated phase offset whereafter phase acquisition is then completed in conventional fashion.

It will be understood by those skilled in the art that certain error conditions must be taken into account in operation of the circuit 10. For example, due to particular signal noise conditions or circuit characteristics precise phase relation calculations may not be possible and a margin of error must be considered. Accordingly, due to such margin of error, it may not be possible to guarantee that the phase relation is in fact restricted to the upper halfplane 97 following the first phase sampling and 90 degree phase shift. Assuming a relatively small margin of error, however, it may be safe to assume that the phase relation is so restricted following the second sampling and phase shift by 45 degrees. More importantly, however, even in the presence of signal noise the first sampling and phase shift excludes the region surrounding the unstable point 94 to reduce maximum lock time.

The circuit 10 of FIG. 4 does not include a component corresponding to the switch 22 of FIG. 1 to illustrate that switch 22 is optional. The constant CENTER FREQUENCY value, corresponding to the default frequency of VCO 18 in FIG. 1, and PHASE ADJUST value, when briefly applied, are very large compared to the FREQUENCY ADJUST signal. The relatively small FREQUENCY ADJUST signal can therefore be maintained, i.e., switch 22 can remain closed, without significant effect on circuit performance.

Phase shifting by predetermined amounts away from the unstable equilibrium point desirably reduces maximum lock time, however, such shifting may result in increased average lock time. Despite a potential increase in average lock time, the present invention provides limited maximum lock time whereby an external circuit requiring use of output signal 14 can provide the START signal to circuit 10 to initiate phase acquisition and, following the maximum lock time, regard output signal 14 as valid.

Thus a simplified fast locking phase locked loop circuit has been shown and described. The circuit achieves reasonably fast phase acquisition while requiring only one phase detector element. The reverse null point or unstable equilibrium point is avoided at the outset of phase acquisition and therefore hang-up is avoided. By avoiding hang-up, maximum lock time is limited and the output signal produced may be more quickly regarded as valid.

We claim:

1. In a phase locked loop circuit including a feedback circuit comprising phase detector means, integrator means providing a substantially continuous correcting signal, and oscillator means, an improvement comprising:
   reset means for said integrator;
   phase shift means for substantially instantaneous phase shifting of said oscillator output; and
   control means for operating said reset means, sampling said correcting signal to establish a desired direction of phase shift, and for operating said phase shift means to phase shift said oscillator substantially instantaneously in said desired direction.

2. The circuit according to claim 1 wherein said desired direction of phase shift is a predetermined magnitude of phase shift to exclude an unstable equilibrium point.

3. The circuit according to claim 1 wherein said control means is adapted to sample said integrator output to establish a halfplane phase relation and determine based on said halfplane phase relation a direction of phase shift away from an unstable equilibrium point.

4. The circuit according to claim 1 wherein said desired direction of phase shift is based on a sign value of said correcting signal.

5. The circuit according to claim 1 wherein sampling said correcting signal determines a halfplane phase relation defined by a stable equilibrium point and an unstable equilibrium point within a range of possible phase relations.

6. A method of establishing a desired phase relation of a first signal relative to a reference second signal, the method comprising:

providing a phase locked loop circuit producing said first signal and including a phase detector for comparing the first and second signals, a resettable integrator responsive to said phase detector for producing a correcting signal as a continuous frequency control for said first signal, and a control for resetting of said integrator and substantially instantaneous phase shifting of said first signal;

resetting said integrator;

sampling said correcting signal to determine a halfplane phase relation between said first and second signals and defined by a stable equilibrium point and an unstable equilibrium point within a range of possible phase relations; and phase shifting said first signal based on said halfplane phase relation whereby said first signal is substantially instantaneously phase shifted away from said unstable equilibrium point.

7. The method according to claim 6 wherein said step of phase shifting said first signal includes phase shifting said first signal by a predetermined magnitude of phase shift.

8. A method of providing a first signal having a desired phase relation relative to a second signal, an initial phase relation between said first and second signals being within a 360 degree phase plane, the method comprising:

sampling the first and second signals to identify one of two halfplanes of said plane containing a present phase relation, said halfplanes being defined by said desired phase relation and a reverse null point spaced 180 degrees from said desired phase relation; phase shifting the first signal substantially instantaneously based on said sampling step to exclude said reverse null point; and phase locking said first signal relative to said second signal by feedback loop circuitry producing a continuous correcting signal based on the phase relation between said first and second signals and applying said correcting signal as a continuous frequency control for said first signal.

9. A method of phase locking a first signal at a desired phase relation relative to a reference second signal, the method comprising:

restricting the phase of said first signal relative to said second signal to within 90 degrees of said desired phase relation;

calculating a phase relation of said first signal relative to said second signal using a single phase detector and assuming said phase relation is restricted to within 90 degrees of said desired phase relation; and phase shifting said first signal to said desired phase relation based on said calculated phase offset.

* * * * *

UNITED STATES PATENT AND TRADEMARK OFFICE
CERTIFICATE OF CORRECTION

PATENT NO. : 5,986,513
DATED : Nov. 16, 1999
INVENTOR(S) : Bruce C. Nepple, et al It is certified that error appears in the above-identified patent and that said Letters Patent is hereby corrected as shown below:

On the title page, item [73],

Assignees: Seiko Corp.; Seiko Epson Corp. both of Tokyo, Japan

Signed and Sealed this

Fifth Day of September, 2000

Attest:

Q. TODD DICKINSON

*Attesting Officer*

*Director of Patents and Trademarks*